United States Patent [19]

Wagers

[11] 4,447,754
[45] May 8, 1984

[54] BROAD BAND SURFACE ACOUSTIC WAVE EDGE DEPOSITED TRANSDUCER

[75] Inventor: Robert S. Wagers, Richardson, Tex.

[73] Assignee: Texas Instruments Incorporated, Dallas, Tex.

[21] Appl. No.: 422,810

[22] Filed: Sep. 24, 1982

[51] Int. Cl.³ ............................................. H01L 31/16
[52] U.S. Cl. ............................ 310/313 R; 310/313 A; 333/141; 333/150; 357/26
[58] Field of Search .......... 310/313 R, 313 A, 313 D, 310/334; 29/25.35; 333/141, 149, 150; 357/26, 71; 427/29, 100

[56] References Cited

U.S. PATENT DOCUMENTS 3,935,564 1/1976 Quate et al. .......................... 333/150
4,019,200 4/1977 Adkins et al. .......................... 357/26
4,211,948 7/1980 Smith et al. .......................... 310/334
4,288,775 9/1981 Bennewitz et al. .................... 357/26

OTHER PUBLICATIONS

Bowers et al., "Design of High Efficiency Wideband SAW Edge Bonded Transducers", '78 Ultrasonic Symposium, 25–27, Sep. '78, pp. 744–748.
Oates, et al., "LiNBO₃ SAW Edge-Bonded Transducers on ST Quartz and <001> Cut GaAs".

Primary Examiner—J. D. Miller
Assistant Examiner—D. L. Rebsch
Attorney, Agent, or Firm—Alva H. Bandy; N. Rhys Merrett; Melvin Sharp

[57] ABSTRACT

A broad band surface acoustic wave (SAW) device has an edge-deposited transducer (EDT) capable of frequencies in excess of 1 GHz and bandwidths in the hundreds of MHz. The device includes a transducer on a semiconductor substrate which is either non-piezoelectric or weakly piezoelectric. The substrate has a sharp, smooth edge formed by the intersection of its top and a side surface. The transducer includes a passivation layer deposited on the side surface of the substrate and a starter layer deposited on the passivation layer; an inner metallic (gold, for example) electrode deposited on the starter layer; a transducer layer deposited on the inner metallic electrode; and an outer metallic electrode deposited on the transducer layer. The outer electrode is formed on the transducer layer one-fifth wavelength below the top surface of the substrate. When the transducer is excited, bulk longitudinal waves are generated in the transducer layer which couple to the longitudinal component of the surface wave in the substrate causing the SAW mode to propagate away from the transducer.

11 Claims, 4 Drawing Figures

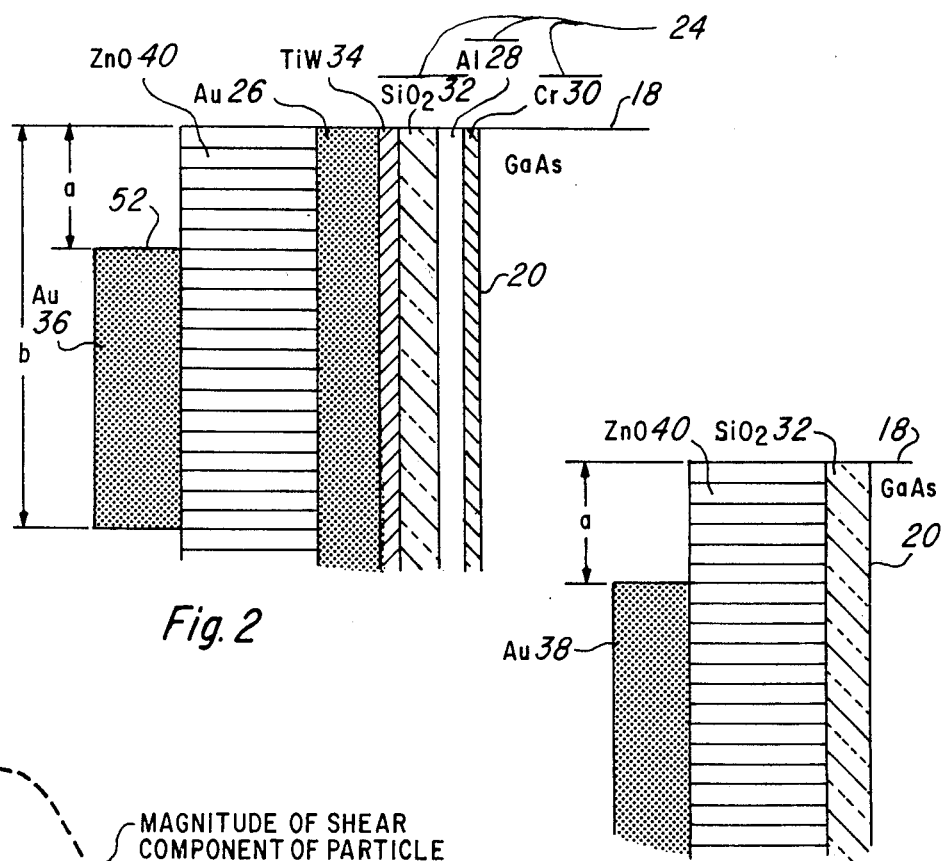
Fig. 2
Fig. 3
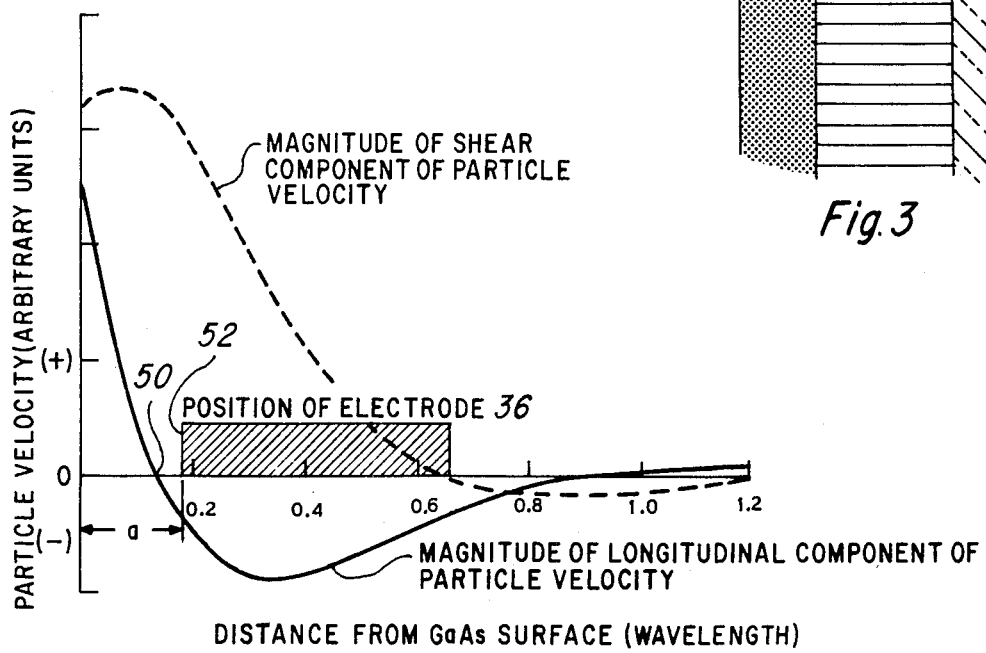
Fig. 4

BROAD BAND SURFACE ACOUSTIC WAVE EDGE DEPOSITED TRANSDUCER

This invention relates surface acoustic wave (SAW) device and more particularly to a device having a transducer for producing surface acoustic waves at high frequencies and broad bandwidth on non-piezoelectric or weakly piezoelectric substrates.

One prior art approach to the excitation of surface acoustic waves on non-piezoelectric substrates has included zinc oxide films with interdigital transducers on the top surface of the substrate. However, this approach is not acceptable because of dispersion and loss introduced by the films on the top surface and because of the narrow bandwidth that results from the use of many electrodes in the propagation direction. This approach is described in the article by F. S. Hickernell, "Zinc-Oxide Thin Film Surface-Wave Transducer", *Proceedings of the IEEE*, vol. 64, pp 631–635 (May 1976).

Another prior art approach to attempt to achieve wideband, low insertion-loss acoustic transduction is the use of an edge-bonded transducer (EBT). In this technique, a half-wavelength slice of a high-coupling piezoelectric material ($LiNbO_3$) is metallically bonded to the edge of the low-coupling substrate and the top surfaces are lapped to extend the corner. Typically indium (or chrome-gold-indium) has been used for the metallic bonding. Edge bonded transducers (EBT) are relatively wideband; however, high frequency operation is precluded because of the technical difficulties in making bonds and piezoelectric slices suitable for extremely high frequency operation. An electrode is fabricated on the outer edge of the EBT and excited with respect to the conductive bond, generating shear waves that convert to surface waves. This technique has been described in the article by D. E. Oates and R. A. Becker, "$LiNbO_3$ Surface Acoustic Wave Edge Bonded Transducer on S. T. Quartz and (001) Cut GaAs," 1980 *Ultrasonics Symp. Proc.* (1980), pp. 367–370, with an $LiNbO_3$ X-cut shear-wave transducer indium-bonded to the GaAs substrate. Shear waves generated in the edge-bonded transducer are converted to surface waves in the GaAs substrate. Low insertion loss and fractional bandwidths of 91 percent at 100 MHz were reported for the GaAs EBT.

Also, while the EBT can potentially lead to wideband low-loss transduction in GaAs, its operation is limited to center frequencies below 200 MHz. Technical difficulties with lapping, bonding, and polishing the $LiNbO_3$ transducer prevent higher frequency operation of the EBT. For example, to fabricate a SAW transversal filter having a 300 MHz center frequency, the thickness of the half wavelength $LiNbO_3$ transducer would be approximately 6.8 $\mu m$. This is less than half the thickness of the transducers used in the before-mentioned article and would present a serious materials fabrication problem. At L-band frequencies, the required thickness is reduced to approximately 1.7 $\mu m$, a thickness clearly unobtainable.

Therefore, it is an object of the present invention to provide a transducer which can generate surface-acoustic waves with wide bandwidth and low insertion loss on different substrate materials.

Another object of the present invention is to generate surface-acoustic wave excitation with high frequency and with a large bandwidth.

Another object of the present invention is to provide a transducer which will generate surface acoustic waves in a semiconductor substrate at high frequencies and large bandwidth.

Another object of the present invention is to provide a device which can be totally fabricated on a monolithic semiconductor material.

Another object of the present invention is to fabricate an edge deposited transducer which provides low spurious signal generation in the form of reflections, bulk waves and dispersion.

Other objects and features of the invention will become more readily understood from the following detailed description and appended claims when read in conjunction with the accompanying drawings, in which like reference numerals designate like parts throughout the figures thereof, and in which:

FIG. 2 is a cross section of the edge deposited transducer of FIG. 1 taken along the section line 2—2.

FIG. 3 is a cross section view of the edge deposited transducer of FIG. 1 taken along the cross section line 3—3.

FIG. 4 is a graph of the desired position of the outer electrode of the edge deposited transducer in relation to the longitudinal component of the surface wave particle velocity.

Figure 1:
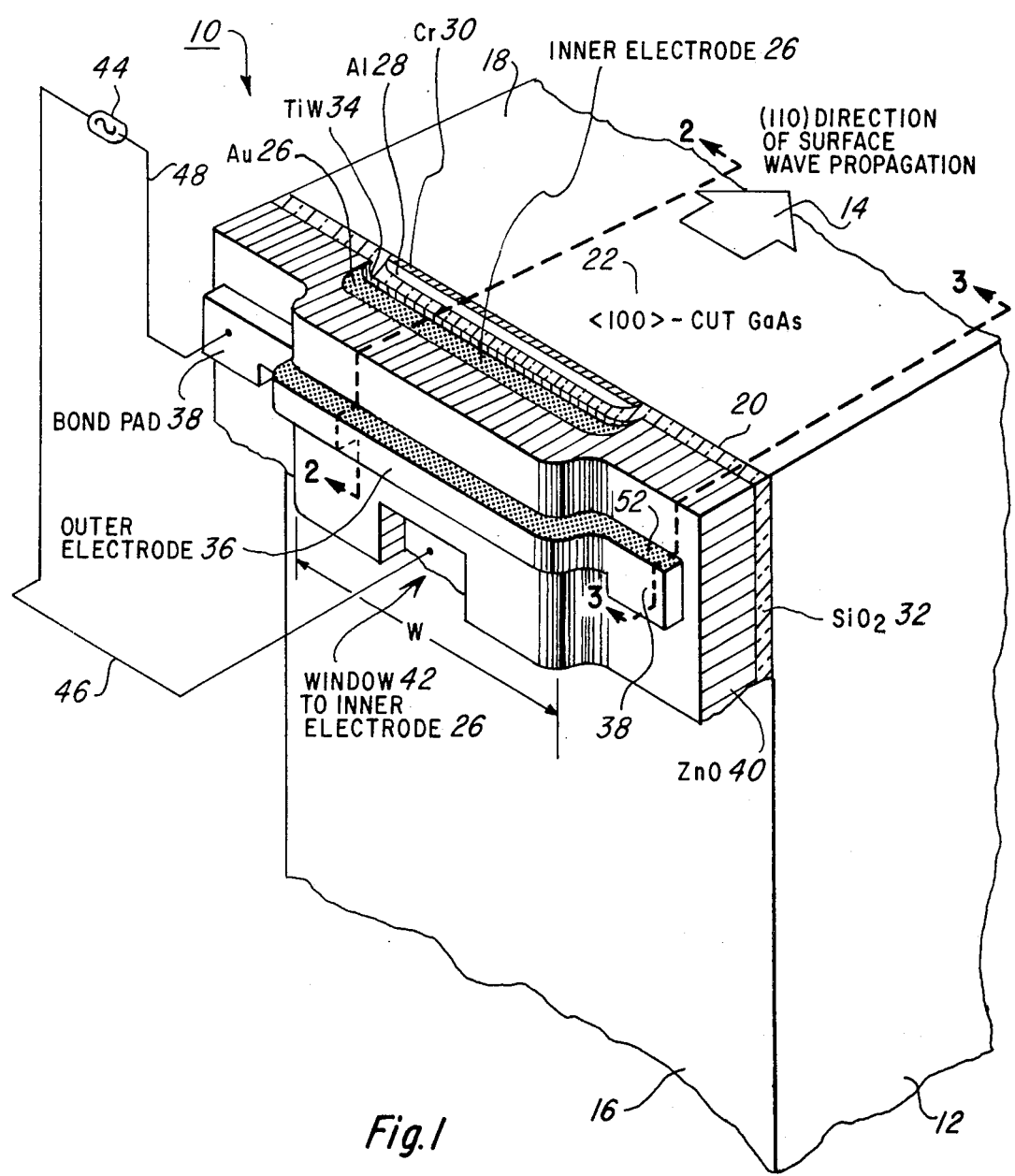
FIG. 1 is a perspective view of the edge deposited transducer constructed according to the present invention.

Referring now to FIGS. 1-3, there is illustrated a surface wave device having an edge deposited transducer (EDT) 10 constructed according to the present invention. Transducer 10 is positioned on a substrate 12; this substrate 12 may be, for example, gallium arsenide (GaAs), silicon (Si), indium phosphide (InP) or quartz. This invention and transducer solves a particular problem by providing a method for carrying out acoustic wave excitation on semiconducting materials, such as silicon and gallium arsenide; silicon is non-piezoelectric and does not provide an inherent means for surface wave excitation while gallium arsenide is weakly piezoelectric and inherently permits only narrow band surface wave excitation with interdigital transducers. For a semiconductor substrate 12, gallium arsenide is preferred because of its unique combination of acoustic, semiconducting and optical properties. When (100) oriented gallium arsenide is utilized as the substrate 12, lossless surface waves may be generated in substrate 12 in the (110) direction indicated by arrow 14. Substrate 12 should be prepared such that its side portion 16 and top portion 18 form a smooth edge 20 without irregularities and chips that intersect top surface 18 where the surface acoustic wave 22 will propagate. Gallium arsenide and silicon lend themselves to this fabrication step through cleaving.

After preparing substrate 12, a passivation layer 24 (FIG. 2) is applied to substrate 12, if necessary, to prevent the intermixing or diffusion of substrate materials and transducer materials. This passivation layer may comprise a plurality of separate layers. If quartz, by way of example, is used as the substrate 12, a passivation layer is not required since the inner electrode material 26 (which will be discussed in more detail below) will not diffuse into the quartz. However, if silicon, gallium arsenide or indium phosphide is used, a passivation layer is desired. For added adhesion between the gallium arsenide substrate 12 and the aluminum layer 28, a chromium layer 30 is deposited or flashed on the side portion 16 of the substrate 12. Next, an aluminum layer 28 is deposited over the Cr layer 30 and corresponds to the dimensions of the inner electrode 26. Aluminum is an excellent isolation layer since temperature degradation tests show that the Al-GaAs system to be very stable with an inner diffusion depth of only a few hundred angstroms at temperatures exceeding 500 degrees C. To prevent capacitive shorting of transducer 10, the aluminum layer 28 and chromium layer 30 (comprising part of passivation layer 24) are only deposited under the region of inner electrode 26.

Inner electrode 26 may be made of gold or aluminum by way of example. Gold also diffuses rapidly into aluminum, and therefore an isolation layer may be required for this purpose. A thin layer 32 of silicon dioxide which may be considered as part of passivation layer 24 can solve this isolation function. As can be seen in FIGS. 1-3, the silicon dioxide isolation layer 32 is deposited over the entire edge of side portion 16 of substrate 12. In addition to performing as an isolation layer 32, the silicon dioxide layer 32 may be used as an acoustic transformer, adjusting its thickness to help control the input impedance of the edge deposited transducer 10 (FIG. 1); in other words, the thickness of the isolation layer 32 may be varied for impedence matching purposes.

A starter layer 34 (FIG. 2) is deposited on passivation layer 24 for added adhesion and a nucleation site for the metallic inner electrode 26. This layer 34 may be deposited by sputtering or evaporation. This starter layer may be, by way of example, titanium (Ti), titanium tungston (TiW) or chromium (Cr).

The inner metallic electrode 26 is deposited over starter layer 34 and may be deposited by sputtering or evaporation, by way of example. Various metals may be deposited, such as aluminum and gold, but gold is the preferred embodiment for the inner electrode 26 material. By depositing a gold film, a (111) orientation for the inner electrode 26 may be obtained. As can be seen more clearly in FIGS. 1 and 3, the gold metallic inner electrode 26 is only deposited under the outer metallic electrode 36 and not under bond pads 38 (FIG. 1). By depositing the inner electrode 26 only under the outer electrode 36, this prevents the formation of additional undesired acoustic transducers under bond pads 38. It also eliminates the potential capacitive shorting between inner electrode 26 and outer electrode 36 that would otherwise result. Both of these effects could greatly degrade the performance of transducer 10 since the area of bond pads 38 is much larger than the area of the outer electrode 36.

The next step in the fabrication of transducer 10 is the deposition of the transducer layer 40 over inner electrode 26 (FIGS. 1 & 2). Typical materials which can be used as the transducer layer 40 are zinc oxide (ZnO) and aluminum nitride (AlN). If gold is selected as the inner electrode material 26, then zinc oxide is preferred as the material for transducer layer 40 whereas if aluminum is chosen as the inner electrode 26, then aluminum nitride is preferred as the transducer material for transducer layer 40. The zinc oxide layer may be sputtered directly onto the gold inner electrode 26, producig a highly C-axis-oriented zinc oxide film. That is, C[Z]-propagation, longitudinal having a coupling constant of 0.302 with no coupling of C[Z]-propagation, shear (B. A. Auld, "Acoustic Fields and Waves in Solids," John Wiley & Sons, Volume 1, Page 308). With strong crystal alignment, the zinc oxide exhibits piezoelectric qualities and has a large piezoelectric coupling coefficient.

The last step in the fabrication process of the transducer 10 is the depositing of the outer metallic electrode 36 (FIGS. 1 & 2) and bond pads 38 (FIGS. 1 & 3). This may be accomplished by using direct-write e-beam lithography. To keep the response of transducer 10 as wide band as possible, it is desirable to keep the various layers of material as thin as possible. The thickness of transducer 10 can be reduced by using a material for outer electrode 36 which mechanically loads transducer 10. Because of this, and because of its high conductivity, gold is a preferred material. Bond pads 38 are kept as small as possible while still being large enough to bond to. A window 42 (FIG. 1) is formed in transducer layer 40 in order to expose a portion of inner electrode 26. An excitation source 44 is connected to the inner electrode 26 by conductor 46 while connected to outer electrode 36 by way of conductor 48 and bond pad 38.

In operation, when an excitation signal is applied by excitation source 44 to outer electrode 36 and inner electrode 26, bulk longitudinal waves only are generated in the zinc oxide transducer layer 40 which couple to the longitudinal component of the surface wave in the gallium arsenide substrate 12. This is to be contrasted with the edge-bonded-transducer described in the prior art Oates and Becker article referenced above which produces a shear wave that couples to the shear wave component of the surface wave.

Referring now to FIG. 4, the velocity profiles for the longitudinal and shear wave components of the surface wave in a gallium arsenide substrate is illustrated. As can be seen from FIG. 4, the magnitude of the shear component of the particle velocity is largest near the surface and the edge-bonded-transducer must be fabricated near the crystal surface to strongly couple to this component. However, in the edge-deposited transducer 10 constructed according to the present invention, the largest coupling to the longitudinal component of the particle velocity in the gallium arsenide substrate occurs when transducer 10 is offset or is a predetermined distance from the top surface 18 of substrate 12. The optimum position of outer electrode 36 of the transducer 10 is illustrated as the distance "a" from the top portion 18 of substrate 12. This distance "a" is no higher than where the magnitude of the longitudinal component of the particle velocity in substrate 12 changes sign for the first time; this occurs at point 50 in FIG. 4. If the top surface 52 (FIG. 4) of outer electrode 36 were to be positioned on the left side of point 50, performance of transducer 10 would be degraded due to the nulling out of a portion of the longitudinal component of the particle velocity of transducer 10, thereby reducing its efficiency. In FIG. 4 it can be seen that the Rayleigh wave motion is retrograde near the surface and reverses its sense at depths greater than approximately one-fifth of a wavelength. Those persons skilled in the art desiring more information concerning FIG. 4 and the stiffined Christoffel equation from which the distance "a" is computed are referred to B. A. Auld, "Acoustic Fields and Waves in Solids," John Wiley & Sons, Volume 11, Page 47 et seq., Pages 92 and 93).

Typical dimensions of an edge-deposited transducer 10 constructed according to the present invention using a zinc oxide transducer layer 40 and a gallium arsenide substrate 12, optimized for 40% bandwidth at a center frequency of 1.1 GHz is set forth in Table 1 below.

TABLE 1

DIMENSIONS OF ALL LAYERS OF MATERIAL USED IN THE ZnO ON GaAs EDT, OPTIMIZED FOR 40-PERCENT BANDWIDTH AT A CENTER FREQUENCY OF 1.1 GHz

| Topographical Feature | Dimension |
|---|---|
| Thickness of Cr—Al isolation layers 28 and 30 | 2000 Å |
| Thickness of $SiO_2$ isolation layer 32 | 2000 Å |
| Thickness of TiW—Au inner electrode 34 and 26 | 4000 Å |
| Thickness of ZnO transducer piezoelectric 40 | 7000 Å |
| Thickness of Au outer electrode 36 | 4000 Å |
| Distance from top surface 18 of GaAs substrate 12 to top of outer electrode 36 ("a") | 6000 Å |
| Distance from top surface 18 of GaAs substrate 12 to bottom of outer electrode 36 ("b") | 20000 Å |
| Length of outer electrode 36 ("w") | 780 μm |
| Dimension of bond pads 38 | 3 by 3 mils |

Although the present invention has been shown and illustrated in terms of a specific apparatus, it will be apparent that changes or modifications can be made without departing from the spirit and scope of the invention as defined by the appended claims.

What is claimed is:

1. A surface acoustic wave device comprising:
   (a) a substrate for transmitting surface waves, said substrate having a top surface and a side surface forming a sharp, smooth edge at their intersection; and
   (b) a transducer means comprising:
      (i) a layer of transducer material having first and second opposing surfaces,
      (ii) an inner metallic electrode deposited on the first surface of the transducer layer,
      (iii) an outer metallic electrode deposited on the second surface of the transducer layer, and
      (iv) means for energizing the electrodes for producing bulk longitudinal waves in the layer of transducer material, said transducer means operatively affixed to the substrate with its outer electrode a distance greater than about one-fifth of a wavelength below the sharp smooth edge of the substrate whereby the bulk longitudinal waves produce surface waves in the substrate with the bulk longitudinal waves coupled to the longitudinal component of the surface waves to produce a surface wave device operably at center frequencies above 200 MHz.

2. A surface acoustic wave device according to claim 1 wherein the substrate is a material selected from the group consisting of GaAs, Si, InP, and quartz; the inner electrode is a material selected from the group consisting of Au and Al, and the transducer layer is a material selected from the group consisting of ZnO and AlN.

3. A surface acoustic wave device according to claim 1 wherein the substrate is a GaAs substrate and the transducer means further includes a passivation layer means affixed to the substrate, the inner electrode is affixed to the passivation layer, the transducer layer is affixed to the inner electrode and the outer electrode is affixed to the transducer layer.

4. A surface acoustic wave device according to claim 3 wherein the passivation layer means comprises a plurality of layers of materials selected from the group consisting of chromium, aluminum and silicon dioxide.

5. A surface acoustic wave device according to claim 4 wherein the passivation layer means comprises a chromium layer affixed on the side surface of the substrate, an aluminum layer affixed to the chromium layer and a silicon dioxide layer affixed to the aluminum layer.

6. A surface acoustic wave device according to claim 3 further including a starter layer affixed to the passivation layer for providing added adhesion and a nucleation site for the inner electrode.

7. A surface acoustic wave device according to claim 6 wherein the starter layer is a material selected from the group consisting of Ti, TiW, or Cr.

8. A surface acoustic wave device according to claim 3 wherein the inner electrode is aluminum and the transducer layer is Aluminum Nitride.

9. A surface acoustic wave device according to claim 3 wherein the inner electrode is a gold layer and the transducer layer is Zinc Oxide.

10. A surface acoustic wave device comprising:
    (a) a [100]-cut gallium arsenide substrate having a (110) direction of surface wave propagation, the substrate having a top surface and a side surface intersecting to form a sharp, smooth edge;
    (b) a passivation layer means deposited on the substrate;
    (c) an isolation layer deposited on the passivation layer;
    (d) a starter layer deposited on the isolation layer;
    (e) a gold inner electrode deposited on the isolation layer;
    (f) a zinc oxide transducer layer deposited on the inner electrode for producing C-axis-oriented zinc oxide film;
    (g) an outer electrode about one-fifth of a wavelength below said sharp, smooth edge deposited on the transducer layer in substantial alignment with the inner electrode; and
    (h) electrode bond pads adjacent said electrodes and operatively connected thereto for substantially eliminating the generation of undesired transducers under said bond pads.

11. A surface acoustic wave device comprising:
    (a) a gallium arsenide substrate having a top surface and a side surface intersecting to form a sharp smooth edge;
    (b) a passivation layer means deposited on the substrate;
    (c) an isolation layer deposited on the passivation layer;
    (d) a starter layer deposited on the isolation layer;
    (e) an aluminum inner electrode deposited on the starter layer;
    (f) an aluminum nitride transducer layer deposited on the inner electrode for generating predominantly bulk longitudinal waves;
    (g) an outer electrode about one-fifth of a wavelength below said sharp smooth edge deposited on the transducer layer in substantial alignment with the inner electrode; and
    (h) electrode bond pads adjacent said electrodes and operatively connected thereto for substantially, eliminating the generation of undesired transducers under the bonding pads.

* * * * *